(12) United States Patent
Barclay et al.

(10) Patent No.: US 11,091,396 B2
(45) Date of Patent: Aug. 17, 2021

(54) HIGH STRENGTH SHAPED ALUMINAS AND A METHOD OF PRODUCING SUCH HIGH STRENGTH SHAPED ALUMINAS

(71) Applicant: Sasol (USA) Corporation, Houston, TX (US)

(72) Inventors: David A. Barclay, Lake Charles, LA (US); Mark M. Chavez, Lake Charles, LA (US)

(73) Assignee: Sasol (USA) Corporation, Houston, TX (US)

( * ) Notice: Subject to any disclaimer, the term of this patent is extended or adjusted under 35 U.S.C. 154(b) by 0 days.

(21) Appl. No.: 16/099,397

(22) PCT Filed: May 20, 2017

(86) PCT No.: PCT/US2017/033831
§ 371 (c)(1),
(2) Date: Nov. 6, 2018

(87) PCT Pub. No.: WO2017/205286
PCT Pub. Date: Nov. 30, 2017

(65) Prior Publication Data
US 2019/0210926 A1    Jul. 11, 2019

Related U.S. Application Data

(60) Provisional application No. 62/340,048, filed on May 23, 2016.

(51) Int. Cl.
*C04B 35/111* (2006.01)
*C04B 35/626* (2006.01)
(Continued)

(52) U.S. Cl.
CPC ............ *C04B 35/111* (2013.01); *C01F 7/023* (2013.01); *C01F 7/025* (2013.01);
(Continued)

(58) Field of Classification Search
CPC .... C01F 7/025; C04B 35/1115; C04B 35/632; C04B 35/6303; C04B 35/62695;
(Continued)

(56) References Cited

U.S. PATENT DOCUMENTS 4,198,318 A * 4/1980 Stowell .................... B01J 21/04
423/626
2005/0234137 A1   10/2005 Rafael
(Continued)

FOREIGN PATENT DOCUMENTS

CN          1189476        8/1998
DE          2921336 A  * 12/1979  ................ B01J 2/10
(Continued)

OTHER PUBLICATIONS

Sasol: "Pural/Catapal High Purity Aluminas", Jan. 2003.

*Primary Examiner* — Noah S Wiese
(74) *Attorney, Agent, or Firm* — Bushman Werner, P.C.

(57) ABSTRACT

A method of producing high strength shaped alumina by feeding alumina power into an agglomerator having a shaft with mixers able to displace the alumina power along the shaft, spraying a liquid binder onto the alumina power as it is displaced along the shaft to form a shaped alumina, and calcining the shaped alumina. The shaped alumina produced having a loose bulk density of greater than or equal to 1.20 g/ml, a surface area less than 10 m²/g, impurities of less than 5 ppm of individual metals and less than 9 ppm of impurities in total, and/or crush strength of greater than 12,000 psi.

13 Claims, 13 Drawing Sheets

(51) Int. Cl.
   *C04B 35/63* (2006.01)
   *C30B 15/10* (2006.01)
   *C30B 35/00* (2006.01)
   *C01F 7/02* (2006.01)
   *C04B 35/632* (2006.01)
   *C09K 8/80* (2006.01)
   *B01J 2/10* (2006.01)

(52) U.S. Cl.
   CPC ...... *C04B 35/1115* (2013.01); *C04B 35/6261* (2013.01); *C04B 35/62695* (2013.01); *C04B 35/632* (2013.01); *C04B 35/6303* (2013.01); *C30B 15/10* (2013.01); *C30B 35/002* (2013.01); *B01J 2/10* (2013.01); *C01P 2002/60* (2013.01); *C01P 2004/61* (2013.01); *C01P 2006/11* (2013.01); *C01P 2006/12* (2013.01); *C01P 2006/14* (2013.01); *C01P 2006/80* (2013.01); *C04B 2235/3218* (2013.01); *C04B 2235/549* (2013.01); *C04B 2235/5436* (2013.01); *C04B 2235/5472* (2013.01); *C04B 2235/6567* (2013.01); *C04B 2235/72* (2013.01); *C04B 2235/77* (2013.01); *C04B 2235/94* (2013.01); *C04B 2235/95* (2013.01); *C04B 2235/96* (2013.01); *C09K 8/80* (2013.01)

(58) Field of Classification Search
   CPC ........ C04B 2235/5472; C04B 2235/95; C04B 2235/549; C04B 2235/5436; C04B 2235/3218; C04B 2235/5454
   See application file for complete search history.

(56) References Cited

U.S. PATENT DOCUMENTS

2007/0280877 A1\* 12/2007 Suchanek ................ B01J 37/10
   423/625
2011/0054196 A1\* 3/2011 Hirota ..................... B01J 23/66
   549/522

FOREIGN PATENT DOCUMENTS

| EP | 0054976 | 6/1982 |
|----|---------|--------|
| FR | 2434789 | 3/1980 |
| JP | 2008-100903 | 5/2008 |
| JP | 2010-001198 | 1/2010 |
| JP | 2016-037421 | 3/2016 |
| JP | 2017-508701 | 3/2017 |
| JP | 2015-500196 | 1/2018 |
| WO | 2005/089934 | 9/2005 |
| WO | 2015034521 | 3/2015 |

\* cited by examiner

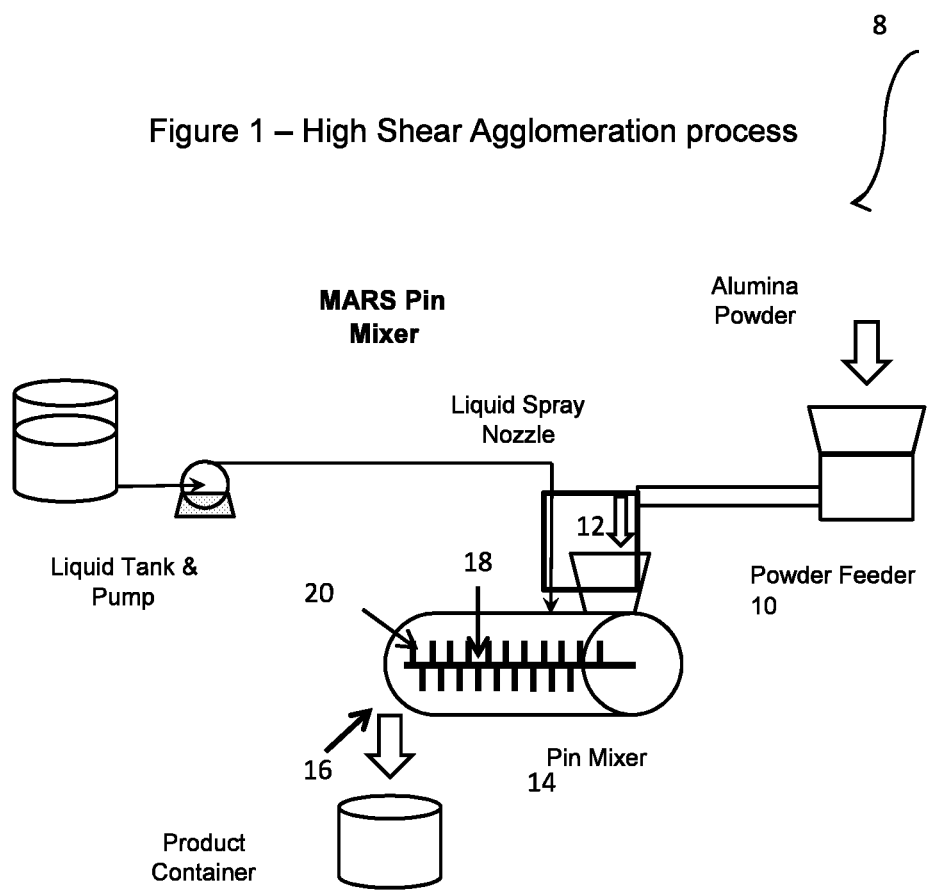
Figure 1 – High Shear Agglomeration process

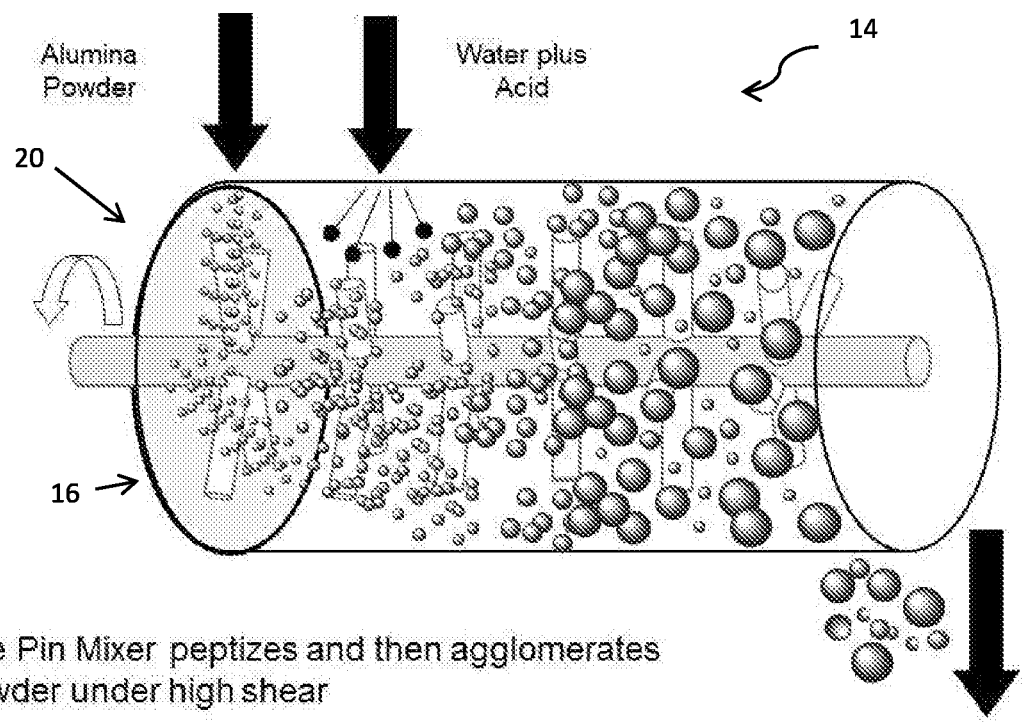
Figure 2 – Continuous High Shear Agglomeration

Figure 3 Effect of powder milling on Bead Strength
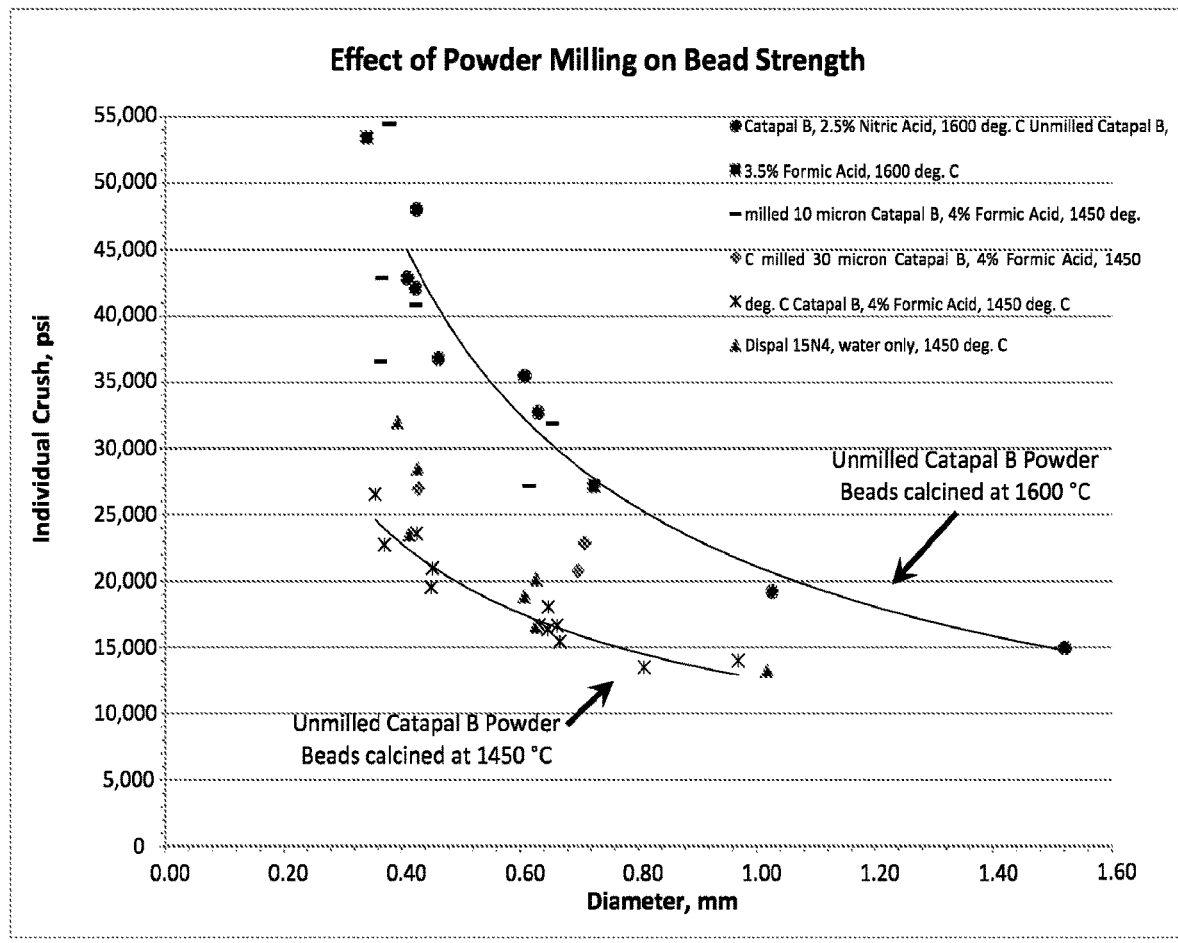
Catapal B, 2.5% Nitric Acid, 1600°C – Comparative Example 3
Unmilled Catapal B, 3.5% Formic Acid, 1600°C – Comparative Example 2 Milled 10
micron Catapal B, 4% Formic Acid 1450°C – Example 2
Milled 30 micron Catapal B, 4% Formic Acid 1450°C – Example 1 Catapal B, 4%
Formic Acid, 1450 °C, 1450 °C – Comparative Example 1 Dispal 15N4, water only,
1450°C – Comparative Example 4

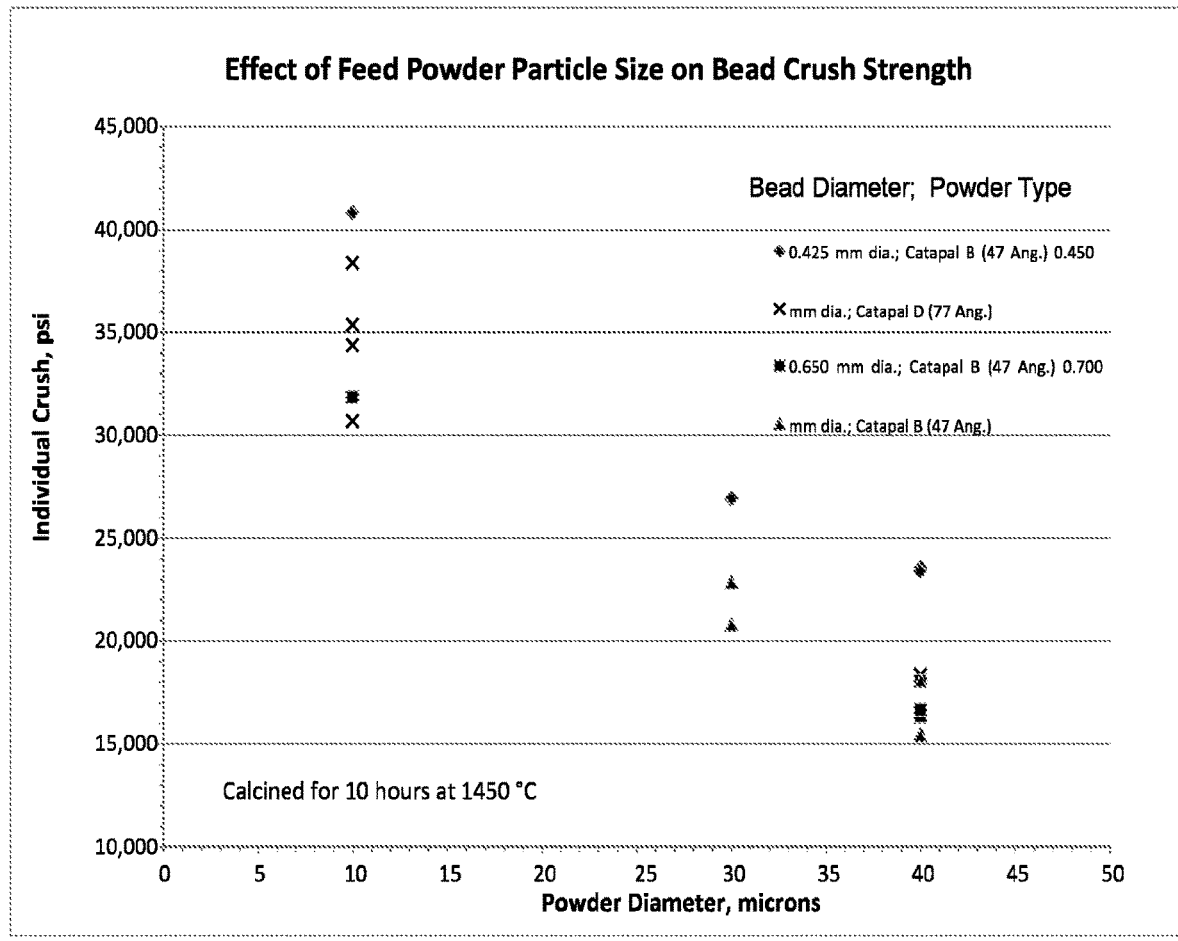
Figure 4 Effect of Feed Powder Particle Size on Bead Crush Strength

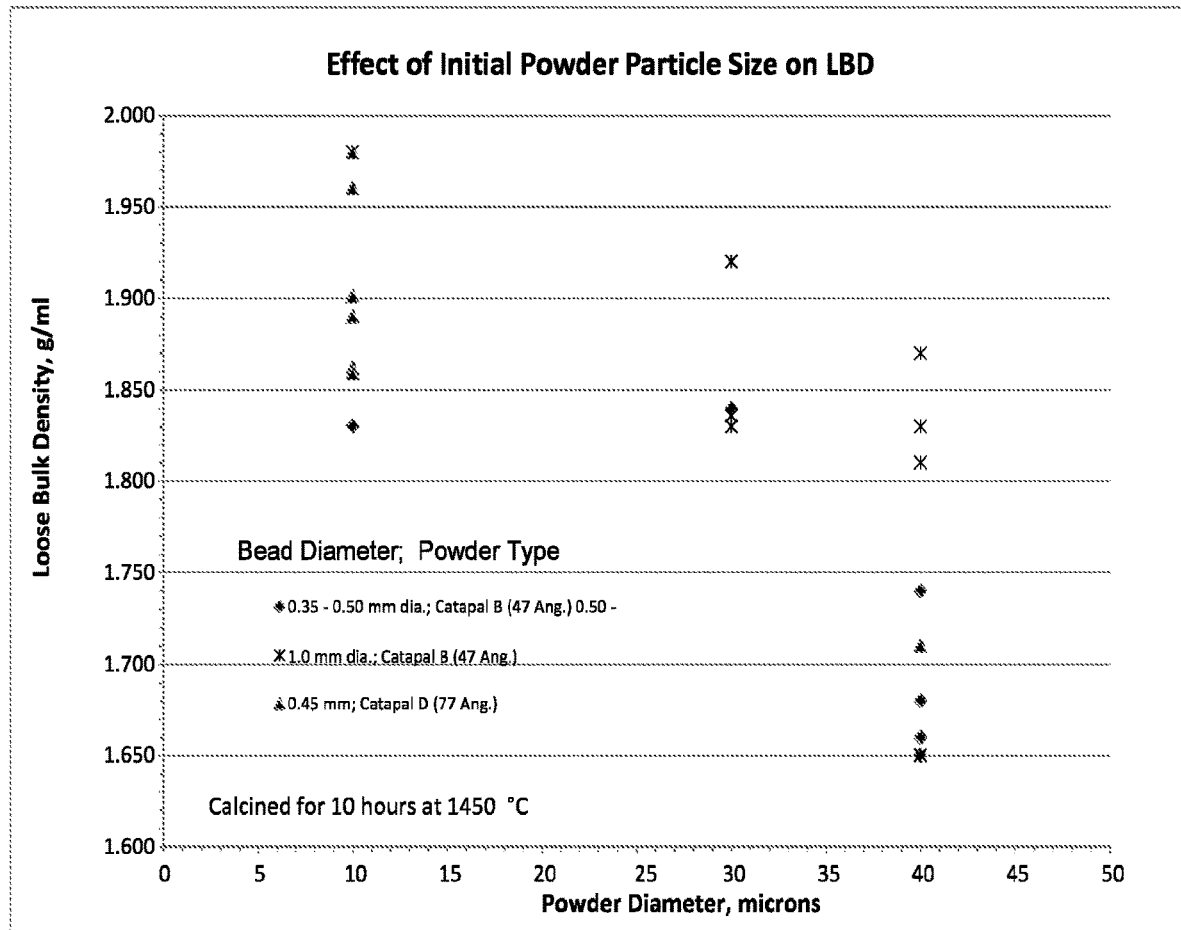
Figure 5 Effect of Initial Powder Particle Size on LBD

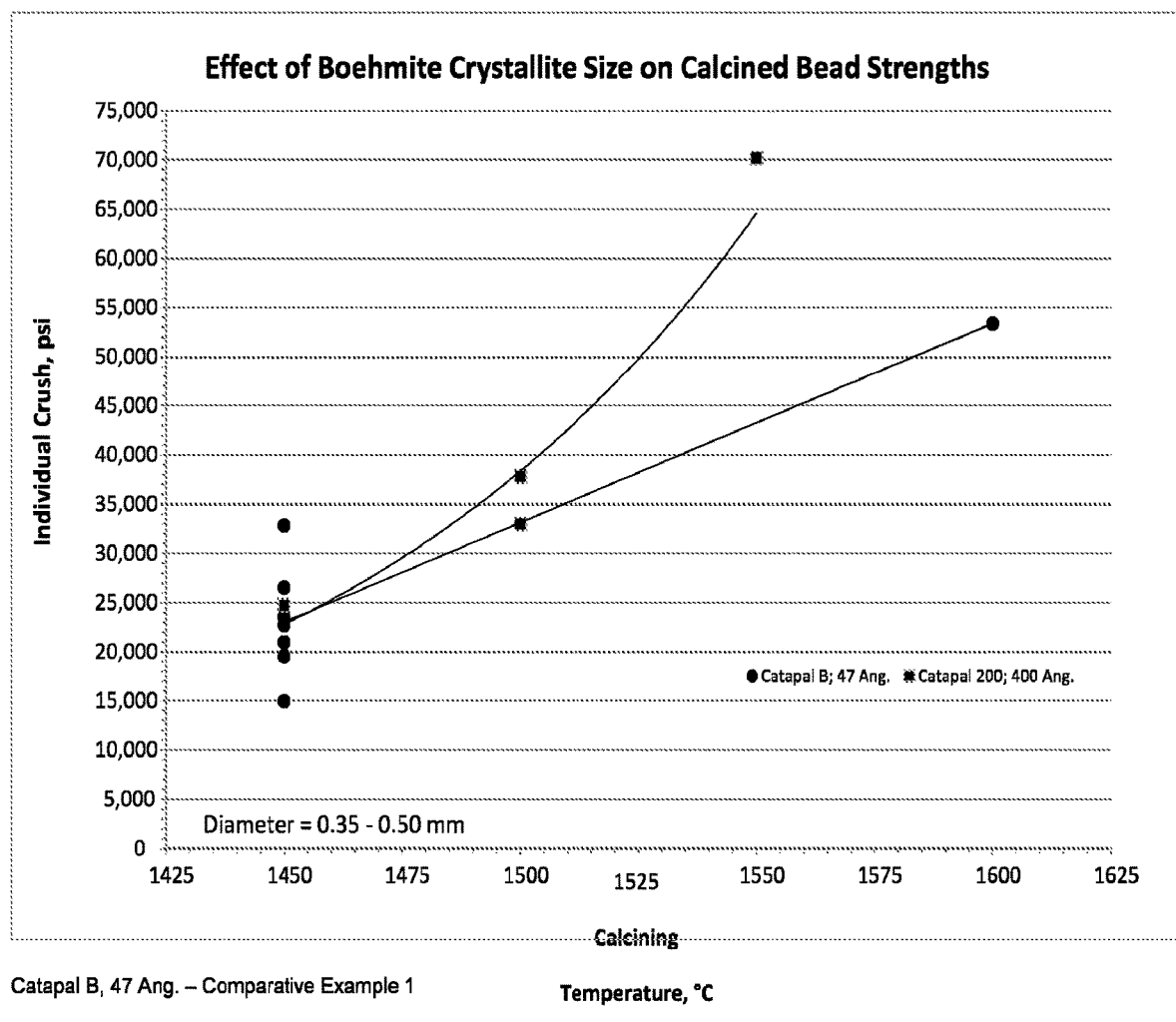
Figure 6 Effect of Boehmite Crystallite Size on Calcined Bead Strengths
Catapal B, 47 Ang. – Comparative Example 1
Catapal 200, 400 Ang – Example 3

Figure 7 Combined Effect of Calcining Temperature, Crystallite Size and Powder Milling on the Strength of Beads
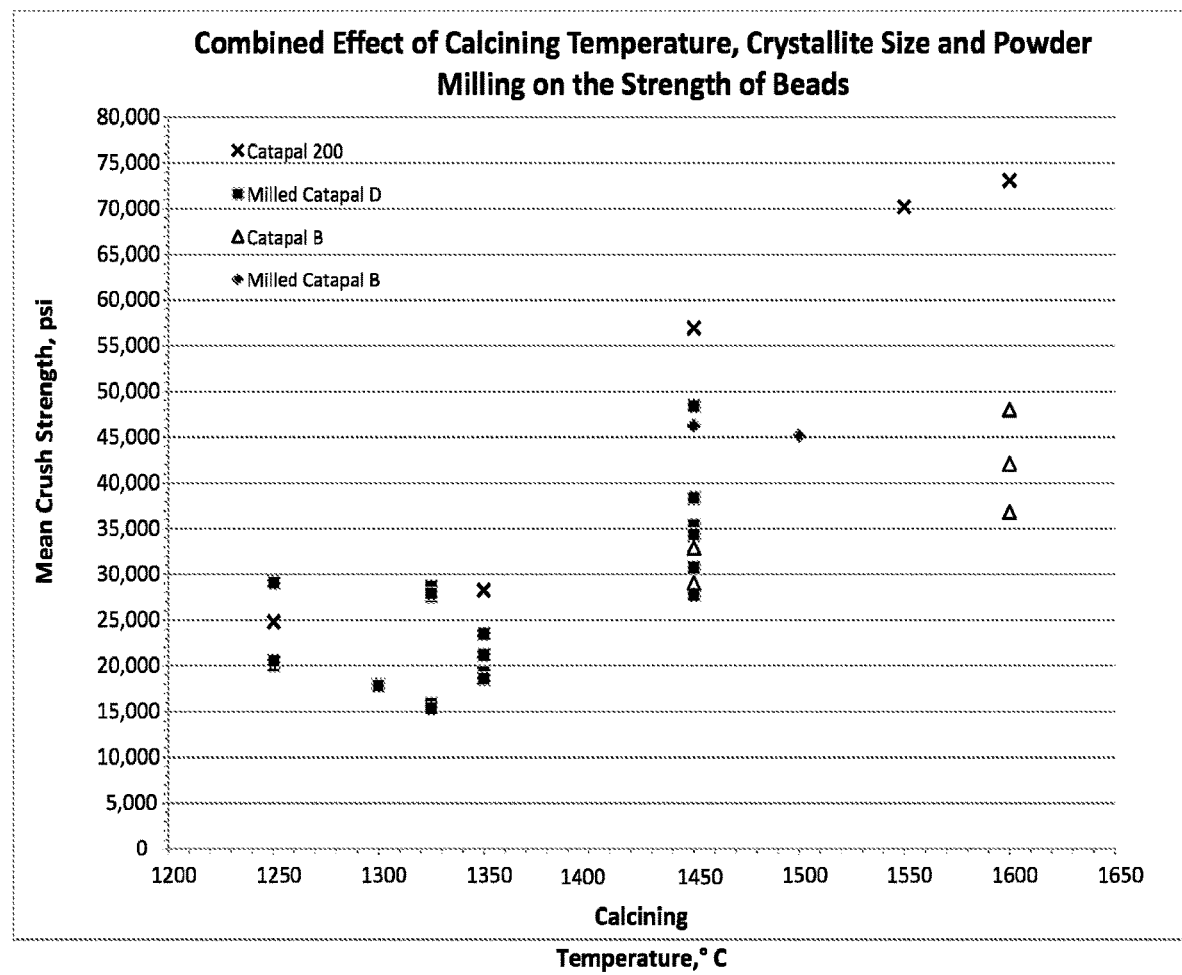
Catapal 200, 400 Ang
Milled Catapal D, 77 Ang
Catapal B, 47 Ang
Milled Catapal B, 47 Ang.

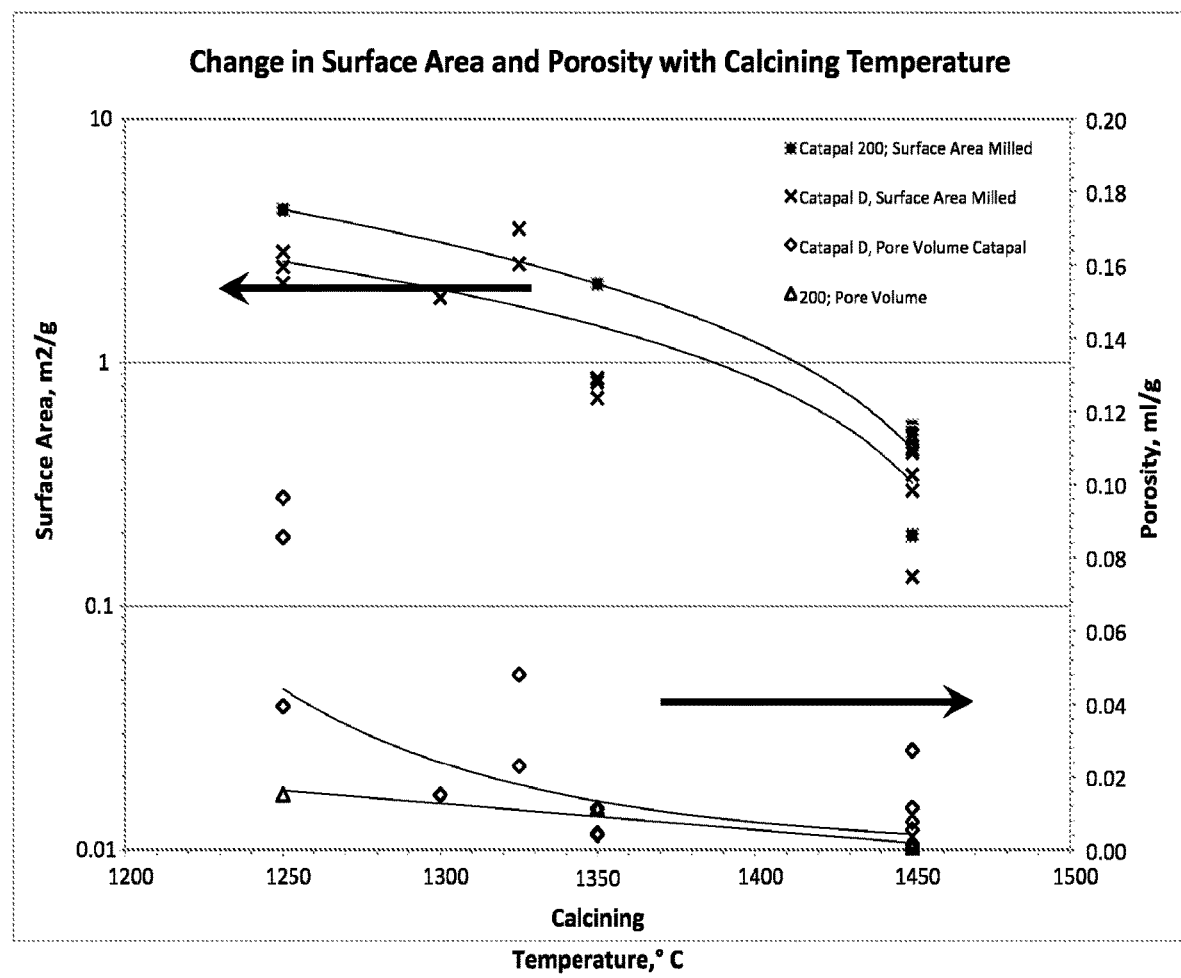
Figure 8 Change in Surface Area and Porosity with Calcining Temperature Figure 9 – Comparison of LBD for Beads Produced with Different Boehmite Crystallite Sizes and Different Powder Particle Sizes at Different Calcining Temperatures
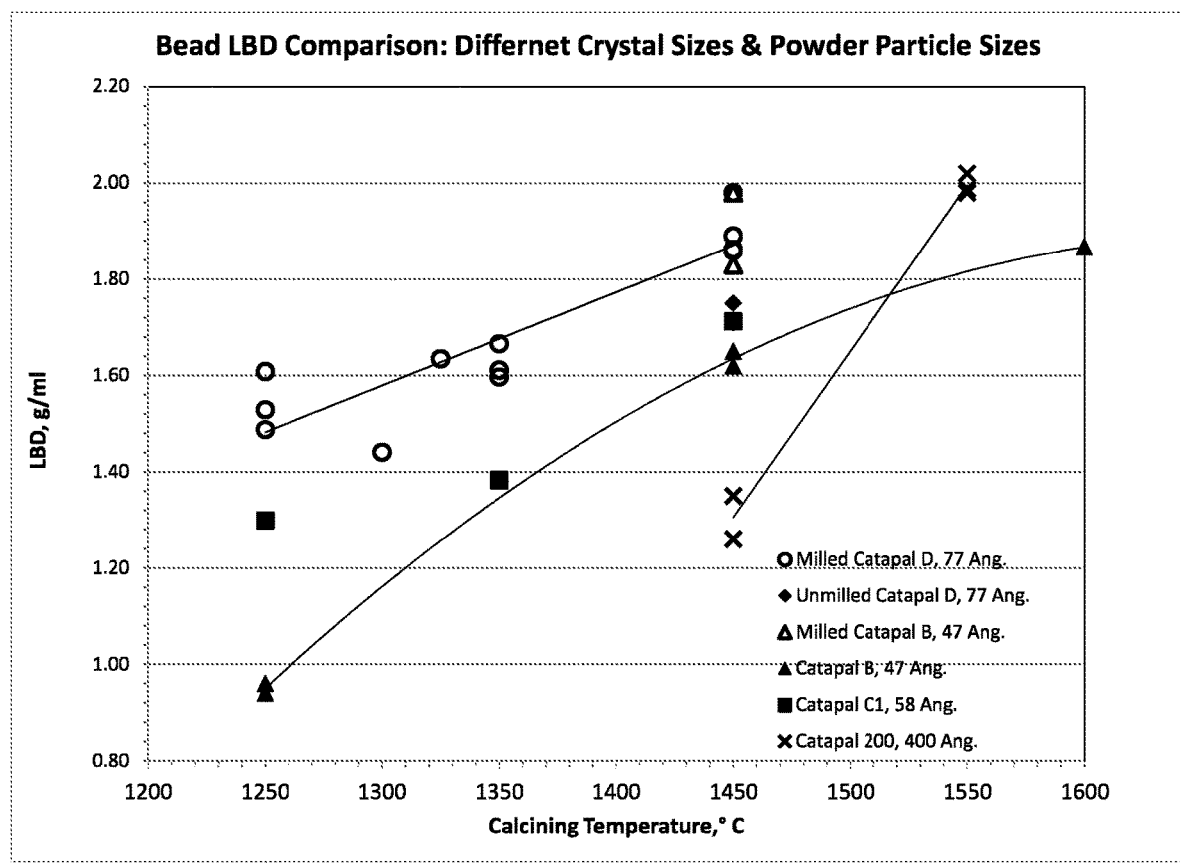

Figure 10 Comparison of LBD for Milled and Unmilled Alumina at Different Crystallite Sizes
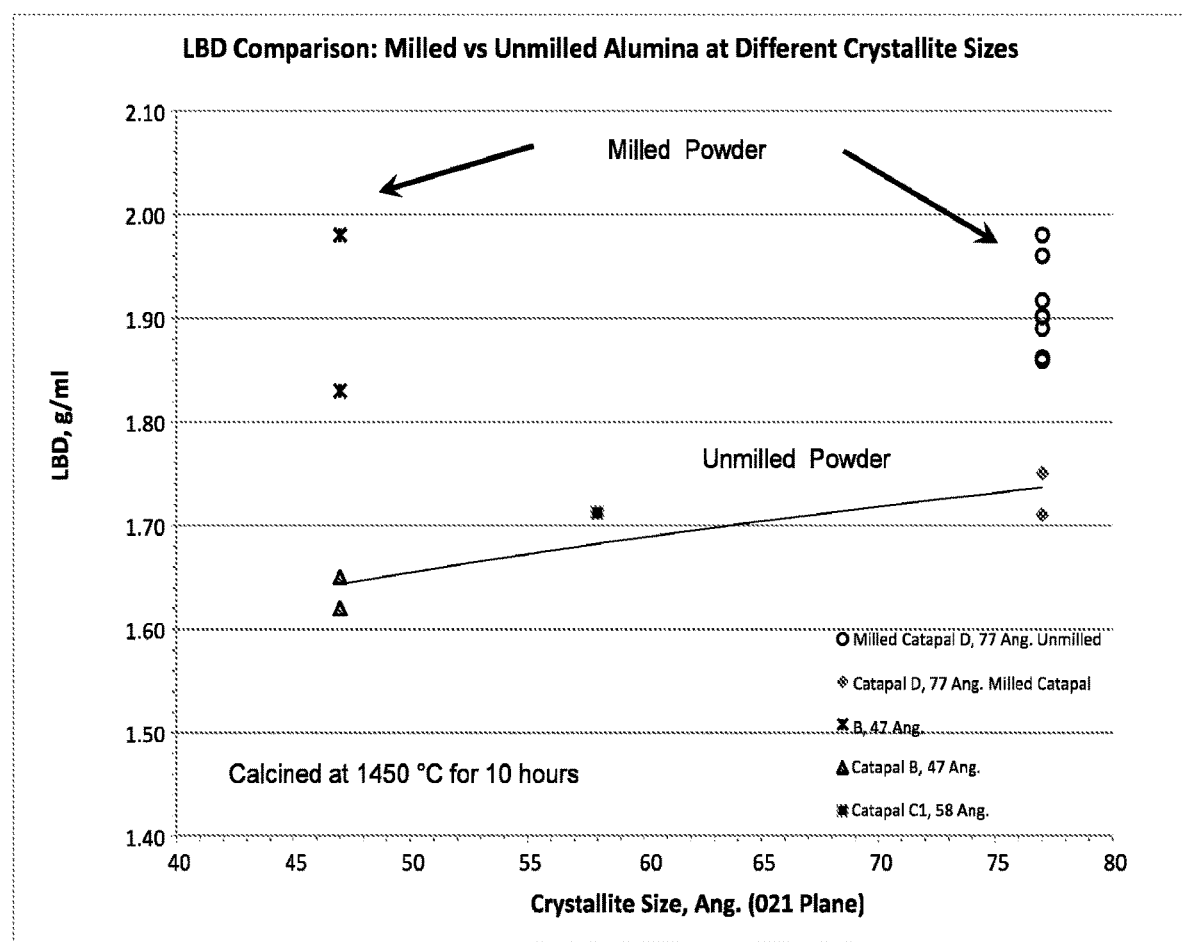

Figure 11 Comparison of Invention Bead Strengths with Commercial Proppant Strengths
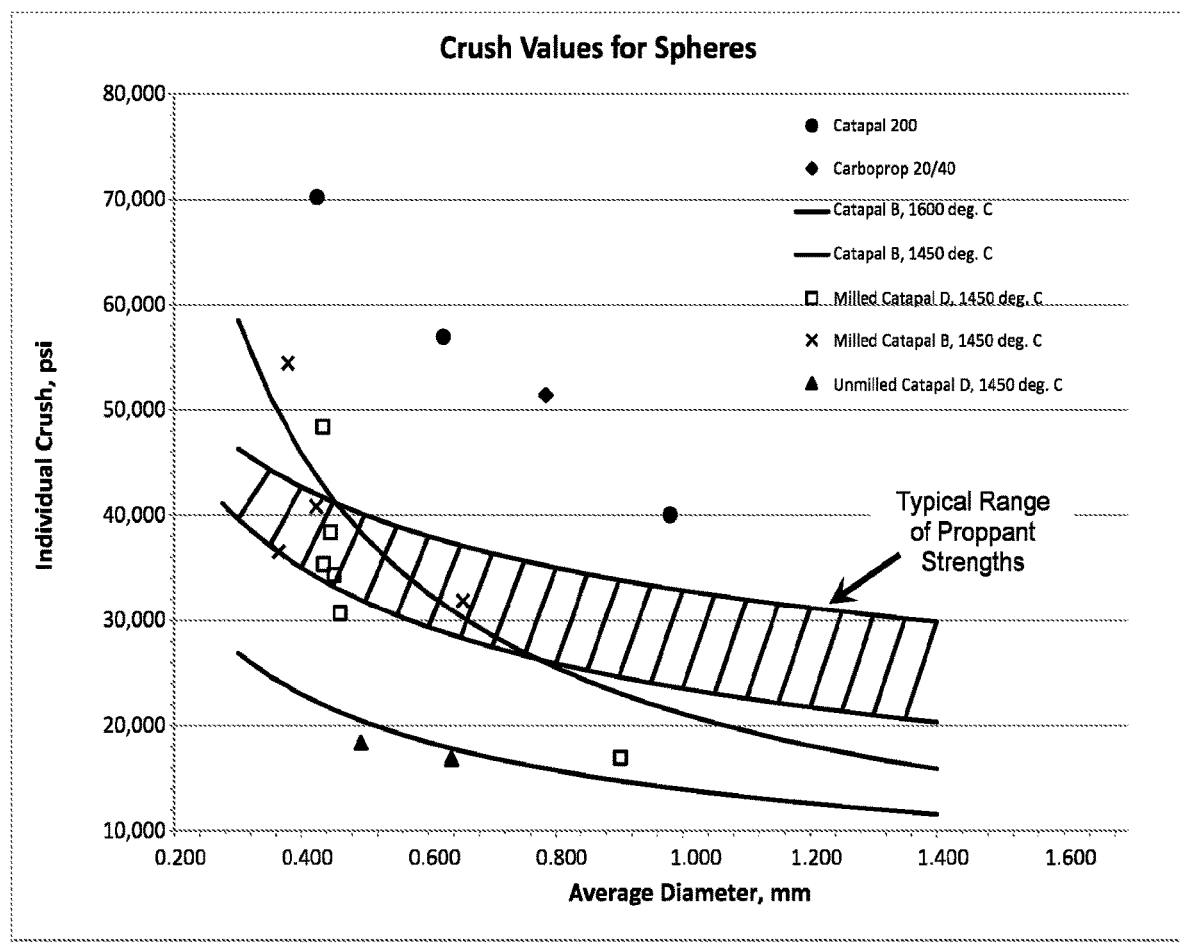
Catapal B, 1600°C is the line above, Catapal B, 1450 °C.

Figure 12 Bead strength of the blended milled Catapal B alumina with Catapal® 200
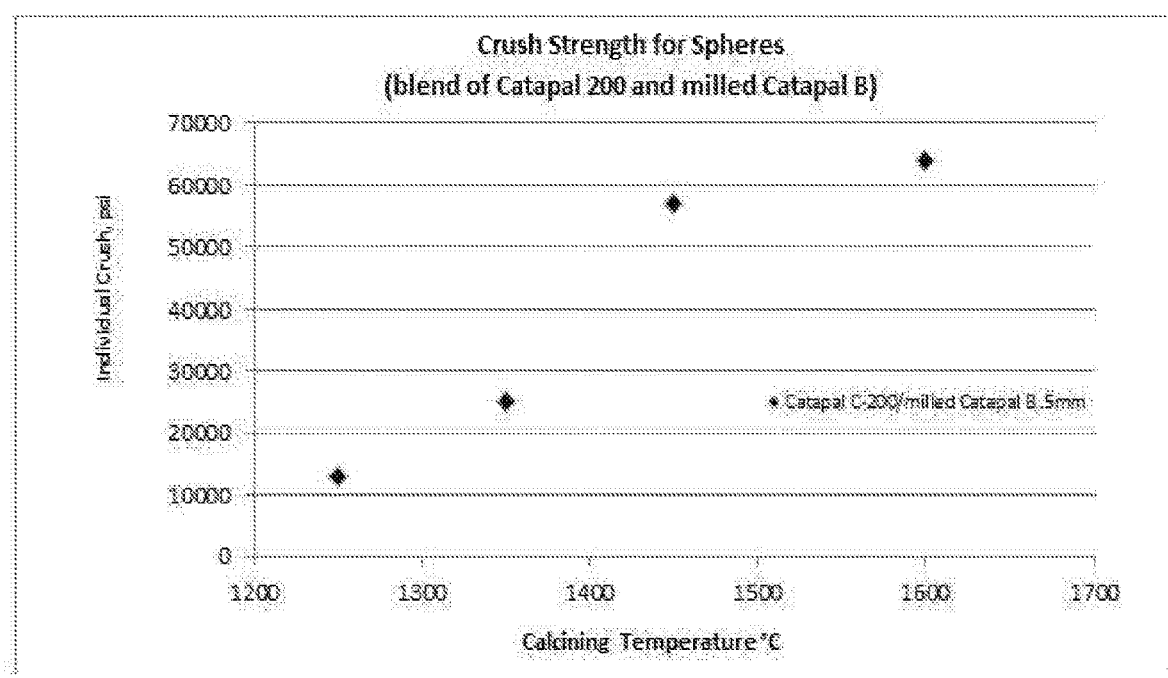

Figure 13 Loose bulk density of blended milled Catapal B with Catapal® -200
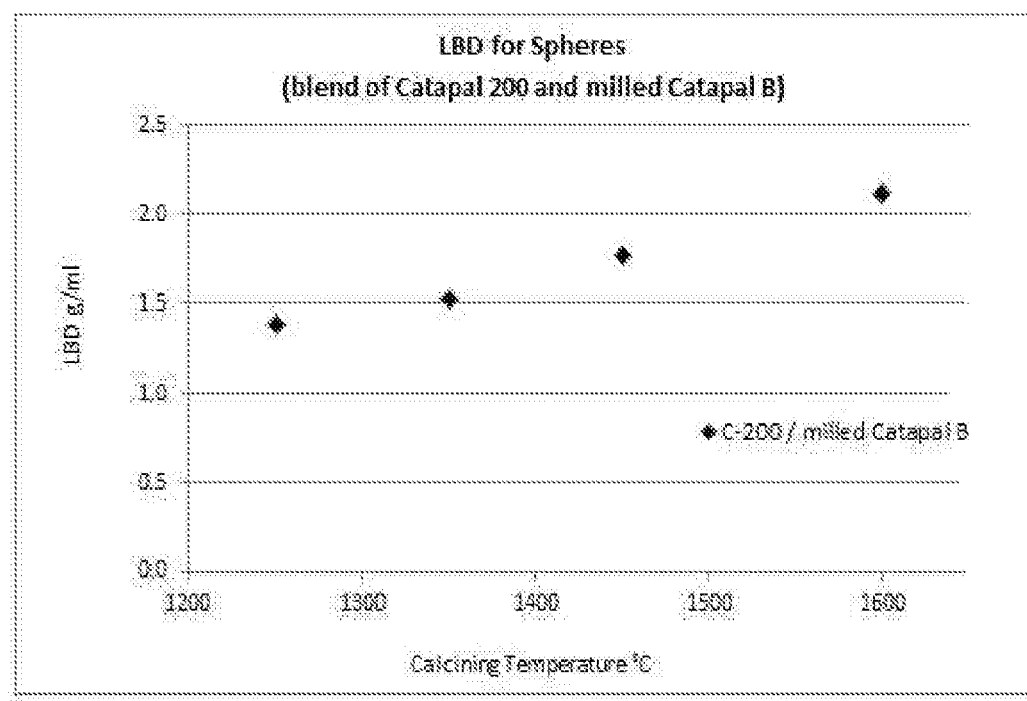

HIGH STRENGTH SHAPED ALUMINAS AND A METHOD OF PRODUCING SUCH HIGH STRENGTH SHAPED ALUMINAS

CROSS REFERENCE TO RELATED APPLICATION

This application is a national phase of PCT/US2017/033831, filed May 22, 2017, which in turn claims priority to U.S. Application 62/340,048 filed on May 23, 2016, the disclosures of which are incorporated herein by reference for all purposes.

This invention relates to a method of producing high strength shaped alumina and to a shaped alumina having low impurities, high strength, controlled porosity and high loose bulk density.

BACKGROUND

High strength shaped alumina in the form of beads, spheres, spherical particles, or agglomerates, for example, are used in numerous applications such as oil field chemical carriers, catalyst supports and catalysts, fillers for refractories and polymers, and proppant particles for oil field use. Shaped alumina with high bulk density is used in making synthetic sapphire by crucible melting processes.

Shaped alumina, for example beads, is normally produced by making a dispersion or sol with feedstock alumina, spraying or dropping the dispersion or sol to form beads, drying the beads to remove water and making the beads strong enough for additional processing, followed by calcining at high temperatures to create a gamma or sintered alpha alumina with high strength and high bulk density. These processes require expensive forming and drying steps due to the large amount of water needed to create the alumina dispersions.

Subsequent conversion to alpha alumina requires high temperature calcination or seeding with alpha alumina to lower the alpha conversion temperature and reduce the cost of sintering the bead to a bead having a low porosity, high density and thus a high strength.

A possible way to reduce the cost of making such beads is to incorporate a spray drying step into the above described process, however such an improvement to the process still limits the bead size to the ability of a spray dryer nozzle to spray droplets into a dryer and get them dried before exiting the dryer.

Calcination is also still needed to create strong, dense granules.

Another method to form alumina beads is a modified drying and agglomeration process which sprays an alumina dispersion onto a fluidized bed of particles to build up the size of the beads while removing water or solvent.

Extrusion plus spheronization processes are other known methods which do not use as much liquid as the dropping or spray drying methods but do require up to 40% to 50% liquid to transform alumina into a pliable or plastic mass which can be shaped by forcing it through a die or extruder. The alumina paste is extruded through a die plate or extruder to create a cylindrical shape which is formed into beads by a high speed tumbling device which breaks the cylinders into pieces and rounds these into beads with the same diameter as the extruded cylinders. The beads must then be dried and calcined to have high strength and a high bulk density.

As outlined above, all of these methods have several inherent problems. They require a large amount of water to disperse alumina and make it formable into drops or extrudates. The water must then be removed carefully to prevent strength degradation. This step is followed by a calcining step which sinters the alumina to get high strength and high bulk density. The drying step and the calcination step cannot be combined because the beads will crack or fail when water is removed at a high rate. Commercial production rates require large equipment and high inherent capital and operating costs.

The invention of the present application overcomes the problems with an agglomeration process that produces high strength, high density shaped alumina at a lower cost and with fewer processing steps than other forming processes.

Invention

According to one aspect of the invention there is provided a method to produce high strength shaped alumina comprising:

i) feeding alumina powder into an agglomerator, the agglomerator including a shaft with mixers able to displace the alumina powder along a length of the shaft, ii) spraying a liquid binder onto the alumina powder as it is displaced along the length of the shaft of the agglomerator to form a shaped alumina iii) calcining the shaped alumina.

To be noted is that there is an increase in the loose bulk density (LBD) of the product of this process without the necessity of seeding the alumina with small alpha alumina particles to enhance sintering and densification i.e. there is no seeding step required in the process of the invention. Furthermore, shaped alumina beads with strength exceeding commercial products are easily produced with a single forming step followed by a single calcination step. This is extremely advantageous when compared with a dropping process that requires formation of a sol, seeding the sol with alpha alumina particles, dropping the sol to form beads, drying the beads to make them strong enough to handle and then calcining the beads to make a dense, high density product.

The shaped alumina may be in the form of agglomerates, beads or spherical particles.

By "agglomerator" is meant a chamber including a central shaft having mixers thereon. The mixers are preferably in the form of pins or paddles located along a length of the shaft. Alumina powder is preferably displaced along a length of the shaft by rotation of the shaft and action of the pins or paddles to move the alumina powder or shaped alumina along the axis of rotation. The shaft rotates continuously such that the mixers are able to firstly break down an alumina powder and then re-agglomerate the alumina powder as the alumina powder is displaced along the length of the shaft of the agglomerator. The agglomerator is preferably a high shear agglomerator. Examples of such high shear agglomerators include a pin mixer, a Turbulizer® mixer (a continuous high shear paddle mixer), or a mixer manufactured by Lödige.

The alumina powder may comprise an aluminum oxide hydroxide (AlOOH), a boehmite, or a pseudoboehmite, preferably a boehmite.

As a first option, the alumina powder may have a crystallite size of 35 Å to 190 Å and a particle size $D_{50}$ value of greater than or equal to 40 micron. As used herein crystallite size refers to the size measurement on the 021 plane as measured by x-ray diffraction using the Scherer equation to determine the crystallite size. By $D_{50}$ value is meant the "median" meaning that 50% of all particles are smaller than the size described and 50% are larger than the size described. The particle size $D_{50}$ value is determined by laser scattering with a Malvern Mastersizer 2000 particle size analyzer. Examples of suitable alumina are Sasol's Catapal® B, Catapal® C1, Catapal® D, and Ultra High Purity Alumina having a crystallite size of 35 Å to 190 Å.

When the alumina powder has a crystallite size of 35 Å to 190 Å and a particle size $D_{50}$ value of greater than or equal to 40 microns, the method further includes the initial step of milling the alumina powder before feeding the alumina powder into the agglomerator to an average particle size $D_{50}$ value of less than 40 microns, preferably an average particle size $D_{50}$ value of 30 microns, and more preferably an average particle size $D_{50}$ value of 10 microns or smaller.

Alternatively, as a second option, the alumina powder may have a crystallite size of 300 Å to 500 Å, preferably from 325 Å to 450 Å. When such aluminas are chosen as a feedstock to the process of the present invention, no milling step is required. Examples of such an alumina are Sasol's Catapal® 200 alumina, Pural® 200 alumina, and Ultra High Purity Alumina having a crystallite size of 300 Å to 500 Å.

The invention provides for a third option, including a combination of i) milling the alumina powder having a crystallite size of between 35 Å and 190 Å and a particle size $D_{50}$ value of greater than or equal to 40 microns to an average particle size $D_{50}$ value of less than 40 microns, preferably an average particle size $D_{50}$ value of 30 microns and more preferably an average particle size $D_{50}$ value of 10 microns or smaller and ii) selecting a suitable alumina powder having a crystallite size of 300 Å to 500 Å, preferably between 325 Å and 450 Å that does not need to be milled.

The alumina powder may include an acid incorporated into the alumina powder as a result of the alumina production process i.e. in situ. For example, Sasol's Dispal® alumina product line or large crystallite aluminas such as Catapal® 200, have acid incorporated into the dry powder. Where the alumina powder contains an acid, the liquid binder used for the method of the invention may comprise only water. An acid may be added to the water if required, for example in the case of selecting the third option. When acid is added to the water up to 4% of the acid may be added to the water.

Where the alumina powder does not include an acid, then the liquid binder may include both water and an acid.

The acids preferably are monovalent acids. These monovalent acids may include nitric acid, formic acid, acetic acid, or mixtures thereof. Carboxylic acids with single or multiple acid sites may also be used. Acids such as lactic and tartaric are examples of these types of acids.

The amount of free liquid binder applied to the alumina powder to get it to form shaped alumina, for example beads, is defined by the weight of alumina powder divided by the weight of liquid binder applied. This is the alumina powder to liquid binder ratio. The ratio of alumina powder to liquid binder ratio can be from 1.5:1 to as high as 15:1 on a weight basis. Preferably the alumina powder to liquid binder ratio is between 1.8:1 and 10:1.

The calcination temperature may vary depending on the crystallite size of the alumina chosen and may be between 1250° C. and 1700° C., preferably 1250° C. to 1600° C., more preferably 1250° C. to below 1500° C. The calcination may be carried out for a period of 1 hour to 40 hours. Calcination time of at least 6 hours is preferable.

The method may be either a batch process or a continuous process.

According to a second aspect of the invention there is provided a shaped alumina produced according to the method(s) of the invention, the shaped alumina comprising, one, more than one, or, all, preferably more than one, and most preferably all of the following properties:
 i) a loose bulk density of greater than or equal to 1.20 g/ml, preferably greater than 1.65 g/ml
 ii) a surface area less than 10 m²/g, preferably less than 5 m²/g,
 iii) impurities of less than 5 ppm, preferably less than 3 ppm, and most preferably less than 2.5 ppm of any individual metal, and less than 9 ppm, preferably less than 7 ppm of impurities in total; and
 iv) crush strength of greater than 12 000 psi.

According to a third aspect of the invention there is provided a shaped alumina comprising one, more than one, or, all, preferably more than one, and most preferably all of the following properties:
 i) a loose bulk density of greater than or equal to 1.20 g/ml, preferably greater than 1.650 g/ml,
 ii) a surface area less than 10 m²/g, preferably less than 5 m²/g,
 iii) impurities of less than 5 ppm, preferably less than 3 ppm, and most preferably less than 2.5 ppm of any individual metal and less than 9 ppm, preferably less than 7 ppm of impurities in total; and
 iv) crush strength of greater than 12 000 psi.

The shaped alumina is preferably in the form of an agglomerate, a bead, a spherical particle, or a mixture thereof.

BRIEF DESCRIPTION OF THE DRAWINGS

The Invention will now be described with reference to the following figures and non-limiting experiments.

In the Figures;

FIG. 1 is a diagram of a high shear agglomeration process flow;

FIG. 2 is a diagram illustrating continuous flow high shear agglomeration;

FIG. 3 is a graph showing the effect of powder milling on shaped alumina i.e. bead strength;

FIG. 4 is a graph showing the effect of feed powder particle size on shaped alumina i.e. bead crush strength;

FIG. 5 is a graph showing the effect of initial powder particle size on loose bulk density;

FIG. 6 is a graph showing the effect of boehmite crystallite size on calcined shaped alumina i.e. bead strengths;

FIG. 7 is a graph showing the combined effect of calcining temperatures, crystallite size and powder milling on the strength of shaped alumina i.e. beads;

FIG. 8 is a graph showing the change in surface area and porosity with calcining temperatures;

FIG. 9 is a graph showing a comparison of loose bulk density for shaped alumina i.e. beads produced with different boehmite crystallite sizes and different powder particle sizes at different calcining temperatures;

FIG. 10 is a graph showing the comparison of loose bulk density for shaped alumina i.e. beads produced with different powder particle sizes (milled or unmilled) at various crystallite sizes;

FIG. 11 is a graph showing the comparison of shaped alumina according to the invention i.e. bead strengths with commercial proppant strengths;

FIG. 12 is a graph showing the crush strength of beads made with blended, milled alumina and Catapal® 200 with calcining temperatures of Example 4; and FIG. 13 is a graph showing the loose bulk density of beads made with blended, milled alumina and Catapal® 200 with calcining temperatures of Example 4.

DETAILED DESCRIPTION OF PREFERRED EMBODIMENTS

The invention describes a method to produce high strength shaped alumina by feeding alumina powder into an agglomerator having a central shaft, spraying liquid binder onto the alumina powder as it is displaced along a length of the shaft of the agglomerator to form shaped alumina. The alumina can be in the form of agglomerates, beads, spherical particles, or combinations thereof. The shaped alumina is then calcined.

An example of the method (8) of the invention is included in FIG. 1. Boehmite alumina powder is fed from an alumina powder feeder (10) to an inlet (12) of an agglomerator (14), being in this example a pin mixer. The pin mixer (14) includes a chamber (16) and a central shaft (18) having mixers (20) thereon. The mixers are preferably in the form of pins or paddles (not specifically shown) located along a length of the shaft (18). The shaft (18) rotates continuously such that the mixers (20) are able to firstly break down an alumina powder and then re-agglomerate the alumina powder as the alumina powder is displaced along the length of the shaft (18) of the pin mixer (14).

The alumina powder comprises aluminum oxide hydroxide, a boehmite, or a pseudoboehmite, but is preferably a boehmite. The alumina powder may as a first option have a crystallite size of 35 Å to 190 Å and a particle size $D_{50}$ value of greater than or equal to 40 microns. In such a case the alumina powder may or may not include an acid in the alumina powder. Such alumina powder is to be milled before being fed into the pin mixer to an average particle size $D_{50}$ value of less than 40 microns, preferably 30 microns and more preferably 10 microns or smaller.

As a second option the alumina powder may have a crystallite size of 300 Å to 500 Å, preferably 325 Å to 450 Å. Such alumina has an average particle size $D_{50}$ value of 40 microns and may include an in situ acid in the alumina powder.

The invention provides for a third option, including a combination of i) milling the alumina powder having a crystallite size of between 35 Å and 190 Å and a particle size $D_{50}$ value of greater than or equal to 40 microns to an average particle size $D_{50}$ value of less than 40 microns, preferably an average particle size $D_{50}$ value of 30 microns and more preferably an average particle size $D_{50}$ value of 10 microns or smaller and ii) selecting a suitable alumina powder having a crystallite size of 300 Å to 500 Å, preferably between 325 Å and 450 Å that does not need to be milled. In short, the third option is a combination of the first and second options.

A liquid binder is sprayed onto the alumina powder(s) just after the powder(s) enters the pin mixer (14). The liquid binder may either be water or a combination of water and acid(s) depending on what alumina powder is chosen for the method of the invention. The acids preferably are monovalent acids. These monovalent acids may include nitric acid, formic acid, acetic acid or mixtures thereof. Carboxylic acids with single or multiple acid sites may also be used. Acids such as lactic and tartaric are examples of these types of acids.

The acid in the liquid binder acts to partially disperse some of the alumina powder. The combination of water and acid(s) acting on the alumina creates a binder for the alumina. In the case of alumina containing an acid, water only may be used as the liquid binder since the acid function is already supplied in the powder feed. However, the invention does not preclude adding additional acid if required. The acid added may be 5 wt %, preferably 4% or less of the liquid binder.

Under high shear action of the mixers (20) i.e. the rotating pins or paddles in the pin mixer (14), the liquid binder is dispersed into the alumina powder. As the liquid binder mixes into the alumina powder, the alumina powder becomes partially dispersed making it adhesive and pliable. The energy from the mixers (20) first breaks up the alumina powder and then forms it into shaped alumina including beads or spherical shapes through agglomeration. Beads are smoothed and rounded by the rotating action within the chamber. Moist shaped alumina in the form of beads, agglomerates, spherical particles, or mixtures thereof are formed and exit the mixer. The beads can be sized by screening to obtain a product with a narrower particle distribution. These beads can be calcined at a calcination temperature of between 1250° C. and 1700° C., preferably 1250° C. to 1600° C., most preferably 1250° C. to below 1500° C. for a period of 1 to 40 hours, preferably at least 6 hours, without further drying. The drying step as required by the prior art is no longer required if the method of the present invention is applied.

FIG. 2 shows a detailed view of the pin mixer (14) of FIG. 1. The mixers (20) or rotating elements of the pin mixer (14) impart high energy into the alumina powder mixed with the liquid binder which accomplishes two actions; a) liquid binder is uniformly dispersed onto the alumina powder and b) the combined action of the acidic binder (either water and in situ acid of the alumina, or water and acid, or both) and high shear in the chamber causes the alumina powder to break down to small nuclei. These nuclei are then forced together by the mixing action and then agglomerate to form larger shaped alumina in the form of agglomerates, beads, spherical particles, or mixtures thereof which in turn are agglomerated to form even larger beads. The bead size is controlled by the ratio of alumina powder to liquid binder, the feed rate of powder which controls the time of agglomeration in the mixer, and the rotational speed of the rotor. The ratio of alumina powder to liquid binder can be from 1.5:1 to as high as 15:1 on a weight basis. Preferably the ratio is between 1.8:1 and 10:1.

The pin mixer (14) shown in FIGS. 1 and 2 represents a continuous agglomerator. However, the process can be performed in a high shear agglomerator that operates batch wise for example.

EXAMPLES

In the examples that follow:

Formic acid or nitric acid is used as an acid in the liquid binder.

An alumina powder to liquid binder ratio of 10:1 to 13:1 is used.

Shaped alumina in the form of beads in the size range of 100 microns to 2 mm in diameter can be made using appropriate powder feed rates and rotor speeds in the agglomerator.

The strength of the beads was measured by crush testing individual beads on a Mecmesin MultiTest 2.5i test stand between parallel plates. At least 25 beads were tested and the results averaged. The force required to crush each single bead was measured as was the diameter of the bead being tested. Crush strength of each bead was calculated as the crush force divided by the cross sectional area of the bead. The strength and diameter values were averaged for the sample of beads. Results are in psi and plotted against the mean diameter of the beads.

Properties of the various powders used in the Examples and shown in the Figures are summarized in Table I. Milled Catapal B alumina refers to either of the two particle sizes created from the base alumina.

TABLE I

Properties of Alumina Powders Used in the Examples

| Powder | Crystallite Size, 021 Plane, Å | Average Powder Particle Size, microns |
|---|---|---|
| Catapal ® B alumina | 47 | 40 |
| Milled Catapal ® B alumina | 47 | 30 |
| Milled Catapal ® B alumina | 47 | 10 |
| Catapal ® C1 alumina | 58 | 40 |
| Catapal ® D alumina | 77 | 40 |
| Milled Catapal ® D alumina | 77 | 10 |
| Dispal ® 15N4 alumina | 186 | 40 |
| Catapal ® 200 alumina | 400 | 40 |

Example 1

Alumina powder, Catapal® B alumina, with a crystallite size of 47 Å on the 021 plane and a particle size $D_{50}$ value of 40 microns was used. The alumina was milled by jet milling to an average particle size $D_{50}$ value of 30 microns. Formic acid diluted to 4% or lower concentration and water made up the liquid binder. The alumina powder and liquid binder were run through the pin mixer and the beads that were produced were subsequently screened to size and calcined at 1450° C. for 10 hours to convert them to alpha alumina agglomerates/beads.

Example 2

The same process as per Example 1 was used except that the starting Catapal® B alumina powder particle size was milled as per the invention, by jet milling the alumina powder to an average particle size $D_{50}$ value of 10 microns.

Example 3

The same process as per Example 1 was followed except Catapal® 200 alumina with a crystallite size of 400 Å was used. Because Catapal® 200 has a crystallite size of 400 Å, it was not milled. Catapal® 200 alumina has formic acid incorporated into it, so this in situ formic acid was supplied as part of the powder feed. The liquid binder was water alone. The powder particle size $D_{50}$ value was 40 microns.

Example 4

Milled Catapal B was blended at 25% ratio with Catapal® 200. The milled Catapal B had a particle size of 4 microns. Beads were processed with no acid. The liquid binder was a blend of water and 1% formic acid. FIG. 13 includes the bulk density and FIG. 12 the crush strength of the blended material.

Comparative Example 1

Alumina powder, unmilled Catapal® B alumina, with a crystallite size of 47 Å on the 021 plane and a particle size $D_{50}$ value of 40 microns was used. Formic acid diluted to 4% or lower concentration and water made up the liquid binder. The alumina powder and liquid binder were run through the pin mixer and the beads that were produced were subsequently screened to size and calcined at 1450° C. for 10 hours to convert them to alpha alumina agglomerates/beads.

Comparative Example 2

The same process as per Comparative Example 1 was used except the beads were calcined at 1600° C. for 10 hours.

Comparative Example 3

Alumina powder, unmilled Catapal® B alumina, with a crystallite size of 47 Å on the 021 plane and a particle size $D_{50}$ value of 40 microns was used. The liquid binder was nitric acid diluted to 2.5% or lower concentration and water. The alumina powder and liquid binder were run through the pin mixer and the beads that were produced were subsequently screened to size and calcined at 1600° C. for 10 hours to convert them to alpha alumina agglomerates/beads.

Comparative Example 4

The same process as per Example 1 was used except that the starting alumina was unmilled Dispal® 15N4 alumina (186 Å). This product has nitric acid incorporated into the alumina during its production. In this example, only water was used as the liquid binder as the acid was in the alumina powder. The powder particle size $D_{50}$ value was 40 microns.

Comparative Example 5

The same process as per Example 1 was followed except Catapal® D alumina with a crystallite size of 77 Å was substituted for Catapal® B alumina. The powder particle size $D_{50}$ value was 40 microns.

FIG. 3 shows the crush strength of beads from some of the Examples and Comparative Examples. Beads from each comparative example and example were screened to different sizes and then tested for crush strength. Mean strength was plotted as a function of the average bead diameter. A typical monotonic curve of crush strength (psi) decreasing with increasing bead diameter is shown by all the example data. Trend lines are included for reference for the unmilled Catapal® B alumina beads calcined at 1450° C. and 1600° C. using formic acid and nitric acid as per Comparative Examples 1 and 3, respectively.

In FIG. 3 it is easily seen that calcining unmilled Catapal® B alumina at 1450° C. (Comparative Example 1) gives lower strength than calcining unmilled Catapal® B at 1600° C. (Comparative Examples 2 and 3). A further comparison between Comparative Example 2 and Comparative Example 3 shows that formic and nitric acid produce similar strength beads at the same calcining temperature.

When the Catapal® B was milled to an average particle size $D_{50}$ value of 30 microns (Example 1), the strength increased compared to the unmilled powder beads (Comparative Example 1) as shown in FIG. 3 though the calcining temperature was kept the same. Milling the Catapal® B powder to an average particle size $D_{50}$ value of 10 microns (Example 2) further increased the strength of the beads to nearly the same as those calcined at 1600° C. Strength was more than doubled for the milled alumina compared to the unmilled alumina under the same binder and calcining conditions.

The data for Comparative Example 4, using Dispal® 15N4 alumina with water as a binder, shows strength similar to the unmilled Catapal B alumina (Comparative Example 1) at the same calcining temperature of 1450° C. This shows that increasing the starting alumina crystallite size (Dispal 15N4, 186 Å) compared to Catapal® B (47 Å) does not provide a strength advantage in this instance.

It is clear from FIG. 3 that the shaped aluminas of the present invention have a high strength even when calcined at a temperature of 1450° C.

To show the advantages of the invention, FIG. 4 plots the particle size of the starting alumina powder (x-axis in microns) with the mean crush strength of the beads on the y-axis, (y axis in psi). FIG. 4 shows mean crush strength for beads with the same average diameter plotted against the starting alumina powder mean particle size $D_{50}$ value. Calcining temperature was constant at 1450° C. with a residence time of 10 hours for all data.

As the powder size decreases, the graph clearly shows the strength significantly increases. The strength increase is not dependent upon the size of the agglomerated bead but rather on the particle size $D_{50}$ value or diameter of the alumina powder fed into the pin mixer. Strength of all the bead sizes increases proportionately to the reduction in diameter of the feed powder.

FIG. 4 clearly shows that milling the starting alumina powder to particle sizes $D_{50}$ values of 30 microns and then 10 microns increases the bead crush strength for all samples. Also in FIG. 4, data for two different alumina powder feeds is shown. Catapal® B powder has a crystallite size of 47 Å (021 plane) and Catapal® D powder has a crystallite size of 77 Å. However, milling the starting powder to a smaller initial size has a similar effect on both powders.

FIG. 5 shows that the loose bulk density (hereinafter "LBD") of the beads is improved by the process of milling the alumina powder prior to feeding into the agglomerator. Smaller particle size alumina powder used in the agglomeration step produces beads that are denser after calcination than a powder with larger initial particle size. This translates to a higher loose bulk density of the agglomerates when the powder is milled than when not milled.

Using the particle size $D_{50}$ value 40 micron alumina powder, efforts were made to increase the LBD by manipulating the operating variables of the pin mixer (powder to liquid ratio, feed rate and rotor speed) with some success. However, milling the powder gave immediate increases in LBD above what could be accomplished with unmilled powders. The effect was similar for powders with different crystallite sizes as shown by the Catapal® B powder (47 Å) and Catapal® D powder (77 Å).

An important advantage of the present invention is that there is an increase in LBD without the necessity of seeding the alumina with small alpha alumina particles to enhance sintering and densification. Seeding is an additional step that is difficult to perform. It requires intensive mixing of the seed and powder to ensure homogeneous distribution of the seed particles. The seeds must be produced to the correct size and quantity to get seeding effects and then mixed into the bulk powder. Seeding is a well-known process but difficult to perform effectively.

Further, by using a boehmite alumina with a crystallite size substantially larger than the first option of 35 Å to 190 Å i.e. as per the second option, in the range of 300 Å to 500 Å, very high crush strength can be achieved without having to calcine the beads at extraordinarily high temperatures.

FIG. 6 shows crush strength for beads formed and produced under similar conditions but using different crystallite size boehmite powders as feed as per Comparative Example 1 and Example 3. At a calcining temperature of 1450° C. the beads made from different crystallite size powders showed similar crush strength. With a small increase in temperature, the very large Catapal® 200 alumina (having a crystallite size of 400 Å) shows a large increase in crush strength compared to Catapal® B alumina (having a crystallite size of 47 Å). Using boehmite with a crystallite size larger than Catapal® B alumina (47 Å) gives much improved crush strength at temperatures which are more economical and easier to achieve than with small crystallite size boehmite.

In FIG. 7, additional results on the combined effects of calcining temperature, alumina powder particle size, and alumina crystallite size on strength of beads are shown. Beginning with a temperature of 1250° C. the bead strength increases monotonically as the calcining temperature is increased to 1600° C. Unmilled Catapal® B alumina produces very strong beads when calcined at 1600° C. Beads with strength equivalent to the unmilled Catapal® B alumina calcined at 1600° C. can be produced with temperatures nearly 200° C. lower than with this small crystallite size boehmite.

To make the process of the invention more economical, the following may be employed: i) milling one of the smaller crystallite size aluminas, in the range of 35 Å to 190 Å, to a smaller particle size $D_{50}$ value, or ii) using a large crystallite size alumina such as Catapal® 200, an alumina powder having a crystallite size of 300 Å to 500 Å, or iii) a combination of i) and ii). These options produce an alumina bead having up to double the strength compared to beads made from unmilled small crystallite size boehmite (having a crystallite size between 35 Å and 190 Å). This strength can be achieved when the temperature of 1450° C. is used. The strength can be altered to the desired level by changing the calcining temperature in a range that is accessible with readily available commercial equipment.

As FIG. 7 shows, beads with very high crush strengths are produced from Catapal® 200 alumina using calcining temperatures greater than 1525° C. This is advantageous for producing a bead with strength equivalent to the very highest strength oil field proppants.

Being able to achieve high strength by selecting different combinations of powder particle size and final calcining temperature is advantageous for adjusting other properties of the beads such as loose bulk density, porosity or adsorption capacity, pore diameter, and surface area. Examples of these will be shown as per FIGS. 8 to 10.

Because strength can be maintained over a wide range of calcining conditions, the physical properties of the beads can be altered as needed for each application. For example in FIG. 8 the surface area and porosity of beads formed from large crystallite size (400 Å Catapal® 200) boehmite and smaller crystallite size, milled Catapal® D (77 Å), milled to a particle size $D_{50}$ value of 10 microns, is shown as a function of the calcining temperature. A wide range of surface area or pore volume can be achieved by altering the calcining temperature. While strength will generally increase with increasing temperature and conversely decreases with lower calcining temperature, the beads of the present invention already have high strength at lower temperatures and so other intrinsic properties can be altered without compromising bead strength.

By either milling the alumina, or selecting a suitable crystallite size, or both, desired intrinsic properties of the beads can be adjusted using the calcining temperature. Strength of the beads will be maintained during this process.

For catalysts and chemical carriers this is important so that the porosity and adsorption capacity can be achieved with beads that are sufficiently strong for their application.

Loose Bulk Density (LBD) is important for crucible fill in the synthetic sapphire industry. High bulk density is desired to maximize the fill weight in an individual crucible. This maximizes the production from a single crucible cycle and lowers costs.

FIG. 9 shows the LBD of alumina beads made by altering the particle size $D_{50}$ value and crystallite size of the feed alumina powder. Increasing the crystallite size or milling to a smaller particle size $D_{50}$ value powder gives beads that have a LBD higher than smaller crystallite size alumina or unmilled powder. For unmilled powder, the graph shows that the LBD increases as the crystallite size is increased for the different calcining temperatures. When the alumina powders are milled, greater increases in the LBD are also seen. LBD approaches 2.0 g/ml at the temperature of 1450° C. using milled Catapal® B (particle size $D_{50}$ value before milling 40 microns and after milling 10 microns) or milled Catapal® D aluminas (particle size $D_{50}$ value before milling 40 microns and after milling 10 microns). Very large crystallite size alumina, Catapal® 200 (crystallite size of 400 Å), shows high LBD without milling when calcined at 1550° C. Suitable selection of crystallite size combined as needed with powder milling can produce beads that with high LBD which will accordingly produce high fill weight.

FIG. 10 shows the more dramatic effect of reducing the powder particle size $D_{50}$ value by milling. LBD results are plotted for a small range of crystallite size aluminas, from 47 Å to 77 Å. Increasing the alumina crystallite size gives a moderate increase in the LBD over the range. However, milling the powder prior to forming beads shows a large improvement in the LBD of the beads made from both the low and high end of the crystallite size range. The Catapal® B (47 Å) produces nearly the same LBD as Catapal D (77 Å) when both are milled to the particle size $D_{50}$ value of 10 micron. These results are all produced with the same calcining temperature.

Comparative Example 6

Comparison of the alumina data with commercial proppants used for oil well fracturing operations is shown in FIG. 11. The range of proppant strengths is shown by the shaded area on the graph and represents the range of strength values for commercial sintered bauxite and silica-alumina proppant beads as taught by Harris, J. T., Finite Element Modeling of Particle Failure in Stressed Particle Bes, M. S. Thesis, Engineering, Mechanics, Pennsylvania State University (2008), incorporated herein by reference for all purposes. Beads produced from Catapal® B alumina with particle size $D_{50}$ value of 40 micron mean powder diameter and calcined at 1450° C. have significantly lower mean crush strength at any diameter than representative proppant types. This is shown by the curve at the bottom of the graph. Increasing the calcining temperature to 1600° C. gives strengths that are within the range of commercial proppants as shown by the upper curve on the graph.

When the same powder is milled to a particle size $D_{50}$ value of 10 micron the crush strength is significantly improved and now is equivalent to the highest strength commercial proppants. And, calcining to 1450° C. is sufficient to achieve this strength. A similar result is seen when milling the larger crystallite size Catapal® D alumina. By modifying the starting diameter of the boehmite powder, strengths matching different proppant types can be obtained using a single raw material. This is advantageous when producing chemical delivery beads for oil field applications. The chemical delivery bead strength should match the strength of the proppant used in the well fracturing operation so that the chemical delivery beads are not degraded under the fracture stress in the well.

Also shown in FIG. 11 is the effect of increasing the crystallite size of the boehmite powder. Normal Catapal® B alumina with 47 Å crystallite size has significantly lower mean crush strength at any diameter than the representative proppant types. Using Catapal® 200 with 400 Å crystallite size gives beads that exceed the strength of the normal Catapal® B alumina and can be calcined to achieve strengths equal to or greater than the strongest commercial proppants shown in the chart. For comparison, a typical high strength commercial proppant, Carboprop® 20/40, is shown. Beads produced from Catapal® 200 alumina have strengths equivalent to this product.

By using the method of the present invention, different feed stocks having different crystallite sizes and particle sizes $D_{50}$ value can be used. Further, by either milling the feedstock, using a feedstock with a higher crystallite size or both, the process provides for varying conditions of calcination, for example calcination conditions which remain within cost effective limits for commercial equipment. When the calcining temperature is increased to those used normally for commercial proppants, the strengths of these beads exceed the values of most commercial proppants. Again what is extremely important to note is that a further seeding step and a drying step is not required for the method of this invention which again is a technical and commercial advantage. Advantages also include the fact that a continuous process can be applied and the fact that simple water can be used as a binder in specific circumstances.

Alumina Product:

Purity of the alumina is a critical issue for sapphire production. Table II shows metals impurity analyses for a) the starting alumina powder, b) the uncalcined beads made by jet milling high purity boehmite and forming in the high shear agglomerator, and c) the beads after calcination. It can be seen that no or very low contamination of the product occurred through the process of the present invention. This low level of potential contamination makes the bead forming method suitable for production of high bulk density crucible fill for synthetic sapphire production processes.

The single forming step does not introduce metallic impurities into the alumina. Combined with the high bulk density that is easily obtained, the product is useful for making synthetic sapphire by crucible melting processes.

TABLE II

Purity of Beads Formed with High Shear Agglomeration

| Description | Ca | Cr | Cu | Fe | Ga | K | Mn | Na | Ni | Si | Ti | Zn | Zr | Total Impurities |
|---|---|---|---|---|---|---|---|---|---|---|---|---|---|---|
| Ultra High Purity Alumina before running through the pin mixer | 2 | ND | ND | 0.7 | ND | ND | <0.2 | ND | ND | 1 | <0.2 | ND | ND | <4.1 |
| Ultra High Purity Alumina after running through the pin mixer but before calcination | <0.2 | ND | ND | 1.4 | ND | ND | <0.2 | 1 | ND | 1 | 0.4 | ND | ND | <4.2 |
| Ultra High Purity Alumina after calcination | 0.3 | ND | ND | 1 | ND | 2 | 0.4 | 1 | ND | 2 | <0.2 | ND | ND | <6.8 |

ND stands for non-detectable
Ultra High Purity Alumina = Pural ® for example

Porosity of the beads can be controlled by controlling variables in both the feed and processing steps. Final pore volume is adjusted by feed selection based upon the particle size, the agglomeration conditions, and the calcining temperature. Various combinations of these can be used singly or in concert to achieve the desired final porosity of the beads.

Some typical properties of the formed beads are given in Table Ill.

TABLE III

Properties of Beads Produced from High Purity Alumina in the Pin Mixer

| Calcining Temperature ° C. | Surface Area $m^2/g$ | Pore Volume ml/g | Loose Bulk Density g/ml |
|---|---|---|---|
| 1450 | 0.822 | 0.0035 | 1.41 |
| 1600 | 0.064 | 0.00026 | 2.15 |

The beads described in this invention can be used as chemical carriers for oil field application, catalyst substrates, feed for various sapphire crystal forming methods that require free flowing, non-dusting particles or for crucible fill in sapphire production, and potentially as proppants for oil well applications

What is claimed is:

1. A method of producing a shaped alumina comprising:
   i) providing an alumina powder, wherein the alumina powder includes
      a) as a first option an alumina powder having a crystallite size of 35 Å to 190 Å and a particle size $D_{50}$ value of greater than or equal to 40 micron, which is milled to an average particle size $D_{50}$ value of less than 40 microns;
      b) as a second option a combination of an alumina powder having a crystallite size of 35 Å to 190 Å and a particle size $D_{50}$ value of greater than or equal to 40 micron, which is milled to an average particle size $D_{50}$ value of less than 40 microns, and an alumina powder having a crystallite size of between 300 Å to 500 Å
   ii) feeding the alumina powder into an agglomerator, the agglomerator including a shaft with mixers able to displace the alumina powder along a length of the shaft
   iii) spraying a liquid binder onto the alumina powder as it is displaced along the length of the shaft of the agglomerator to form a shaped alumina, and
   iv) calcining the shaped alumina.

2. The method of claim 1 wherein the alumina powder comprises an aluminum oxide hydroxide (AlOOH), a boehmite, or a pseudoboehmite.

3. The method of claim 1, wherein the alumina powder having a crystallite size of 35 Å to 190 Å and a particle size $D_{50}$ value of greater than or equal to 40 micron is milled to an average particle size $D_{50}$ value of 30 microns.

4. The method of claim 1, wherein the alumina powder having a crystallite size of 35 Å to 190 Å and a particle size $D_{50}$ value of greater than or equal to 40 micron is milled to an average particle size $D_{50}$ value of 10 microns or smaller.

5. The method of claim 1, wherein the alumina powder comprises an acid incorporated into the alumina powder as part of an alumina production process.

6. The method of claim 5, wherein the liquid binder comprises water.

7. The method of claim 1, wherein the liquid binder comprises water and an acid.

8. The method of claim 1 wherein the ratio of alumina powder to liquid binder is from 1.5:1 to 15:1 on a weight basis.

9. The method of claim 8, wherein the ratio of alumina powder to liquid binder is from 1.8:1 to 10:1.

10. The method of claim 1, wherein the calcination temperature is from 1250° C. to 1700° C. and the calcination is carried out for a period of 1 hour to 40 hours.

11. A shaped alumina produced according to the method of claim 1, and having all of the following properties:
   i) a loose bulk density of greater than or equal to 1.20 g/ml,
   ii) a surface area less than 10 $m^2/g$,
   iii) impurities of less than 5 ppm of any individual metal and less than 9 ppm in total; and
   iv) crush strength of greater than 12 000 psi.

12. A shaped alumina comprising all of the following properties:
   i) a loose bulk density of greater than or equal to 1.20 g/ml,
   ii) a surface area less than 10 $m^2/g$,
   iii) impurities of less than 5 ppm of any individual metal and less than 9 ppm in total; and
   iv) crush strength of greater than 12 000 psi.

13. A shaped alumina comprising
i) a loose bulk density of greater than or equal to 1.20 g/ml;
ii) impurities of less than 5 ppm of any individual metal and less than 9 ppm in total;
and at least one of the following properties:
iii) a surface area less than 10 m²/g; and
iv) crush strength of greater than 12 000 psi.

* * * * *